(12) United States Patent
Park et al.

(10) Patent No.: US 11,081,440 B2
(45) Date of Patent: Aug. 3, 2021

(54) INTERPOSER AND SEMICONDUCTOR PACKAGE INCLUDING THE SAME

(71) Applicant: Samsung Electronics Co., Ltd., Suwon-si (KR)

(72) Inventors: Yu-Kyung Park, Hwaseong-si (KR); Seung-kwan Ryu, Seongnam-si (KR); Min-seung Yoon, Yongin-si (KR); Yun-seok Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 38 days.

(21) Appl. No.: 16/563,202

(22) Filed: Sep. 6, 2019

(65) Prior Publication Data

US 2020/0312760 A1 Oct. 1, 2020

(30) Foreign Application Priority Data

Mar. 26, 2019 (KR) .................. 10-2019-0034486

(51) Int. Cl.
*H01L 23/498* (2006.01)
*H01L 25/18* (2006.01)
*H01L 21/48* (2006.01)
*H01L 23/538* (2006.01)

(52) U.S. Cl.
CPC ...... *H01L 23/49838* (2013.01); *H01L 21/481* (2013.01); *H01L 21/486* (2013.01); *H01L 21/4853* (2013.01); *H01L 23/49827* (2013.01); *H01L 23/49894* (2013.01); *H01L 23/5384* (2013.01); *H01L 25/18* (2013.01)

(58) Field of Classification Search
CPC .......... H01L 23/49827; H01L 23/5384; H01L 23/498–49894; H01L 23/538–5389
See application file for complete search history.

(56) References Cited

U.S. PATENT DOCUMENTS

| 8,399,987 | B2 | 3/2013 | Kwon et al. |
| 9,478,500 | B2 | 10/2016 | Chen et al. |
| 10,079,157 | B2 | 9/2018 | Paek et al. |
| 10,134,706 | B2 | 11/2018 | Pan et al. |
| 2008/0150118 | A1* | 6/2008 | Van Veen ................ H01L 24/97 257/688 |

(Continued)

FOREIGN PATENT DOCUMENTS

| JP | 2011044552 A | 3/2011 |
| JP | 2013021085 A | 1/2013 |
| KR | 101247986 B1 | 3/2013 |

*Primary Examiner* — Scott B Geyer
(74) *Attorney, Agent, or Firm* — Harness, Dickey & Pierce, P.L.C.

(57) ABSTRACT

An interposer includes: a base substrate; an interconnection structure on a top surface of the base substrate and including a metal interconnection pattern; an upper passivation layer on the interconnection structure and having compressive stress; a lower passivation layer under a bottom surface of base substrate, the lower passivation layer having compressive stress that is less than the compressive stress of the upper passivation layer; a lower conductive layer under the lower passivation layer; and a through electrode penetrating the base substrate and the lower passivation layer. The through electrode electrically connects the lower conductive layer to the metal interconnection pattern of the interconnection structure.

19 Claims, 20 Drawing Sheets

(56) References Cited

U.S. PATENT DOCUMENTS

| | | | |
|---|---|---|---|
| 2009/0072384 A1* | 3/2009 | Wong | H01L 25/0655 257/712 |
| 2009/0294993 A1* | 12/2009 | Hsu | H01L 23/49827 257/779 |
| 2014/0131858 A1* | 5/2014 | Pan | H01L 24/19 257/737 |
| 2014/0293564 A1* | 10/2014 | Murayama | H05K 1/0271 361/767 |
| 2014/0332957 A1* | 11/2014 | Kao | H01L 23/3135 257/738 |
| 2016/0172287 A1* | 6/2016 | Arisaka | H01L 23/49816 257/774 |
| 2016/0307847 A1* | 10/2016 | Lee | H01L 23/544 |
| 2016/0351472 A1* | 12/2016 | Park | H01L 25/0657 |
| 2017/0047294 A1* | 2/2017 | Chang | H01L 23/5389 |
| 2017/0229388 A1* | 8/2017 | Fukasawa | H01L 23/5389 |

* cited by examiner

INTERPOSER AND SEMICONDUCTOR PACKAGE INCLUDING THE SAME

CROSS-REFERENCE TO RELATED APPLICATION

This application claims the benefit of Korean Patent Application No. 10-2019-0034486, filed on Mar. 26, 2019, in the Korean Intellectual Property Office, the disclosure of which is incorporated herein in its entirety by reference.

BACKGROUND

Inventive concepts relate to an interposer and a semiconductor package including the interposer, and more particularly, to an interposer capable of suppressing warpage and a semiconductor package including the interposer.

As the diameter of a semiconductor wafer such as a silicon wafer increases, the semiconductor wafer may warp more easily. For example, when a large-area interposer is manufactured or when a semiconductor package process is performed by using an interposer, the interposer and/or the semiconductor package may warp due to a coefficient of thermal expansion (CTE) difference between the individual components of the interposer or the semiconductor package.

SUMMARY

Inventive concepts provide an interposer having improved reliability by suppressing warpage and a semiconductor package including the interposer.

Also, inventive concepts provide a method of manufacturing an interposer having improved reliability by suppressing warpage and a method of manufacturing a semiconductor package including the interposer.

According to an aspect of inventive concepts, there is provided an interposer including: a base substrate; an interconnection structure on a top surface of the base substrate, the interconnection structure including a metal interconnection pattern; an upper passivation layer on the interconnection structure, the upper passivation layer having compressive stress; a lower passivation layer under a bottom surface of the base substrate, the lower passivation layer having compressive stress that is less than the compressive stress of the upper passivation layer; a lower conductive layer under the lower passivation layer; and a through electrode penetrating the base substrate and the lower passivation layer, the through electrode electrically connecting the lower conductive layer to the metal interconnection pattern of the interconnection structure.

According to another aspect of inventive concepts, there is provided an interposer including: a base substrate; an interconnection structure on a top surface of the base substrate, the interconnection structure including a metal interconnection pattern; a connection pad arranged on a top surface of the interconnection structure, the connection pad being electrically connected to the metal interconnection pattern of the interconnection structure; an upper passivation layer covering a top surface of the interconnection structure, the upper passivation layer having compressive stress, a thickness of the upper passivation layer being greater than or equal to a thickness of the connection pad; and a lower passivation layer under a bottom surface of the base substrate such that the bottom surface of the base substrate covers the lower passivation layer, the lower passivation layer having compressive stress.

According to another aspect of inventive concepts, there is provided a semiconductor package. The semiconductor package includes a base substrate; an interconnection structure on a top surface of the base substrate, the interconnection structure including a metal interconnection pattern; a connection pad on the interconnection structure, the connection pad being electrically connected to the metal interconnection pattern of the interconnection structure; an upper passivation layer on the interconnection structure, the upper passivation layer covering a portion of the connection pad, and the upper passivation layer having compressive stress; a lower passivation layer under a bottom surface of the base substrate, the lower passivation layer having compressive stress; a lower conductive layer under the lower passivation layer; a through electrode penetrating the base substrate and the lower passivation layer, the through electrode electrically connecting the lower conductive layer to the metal interconnection pattern of the interconnection structure; and at least one semiconductor chip on an interposer, the interposer including the base substrate, the interconnection structure, the connection pad, the upper passivation layer, the lower passivation layer, the lower conductive layer, and the through electrode.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
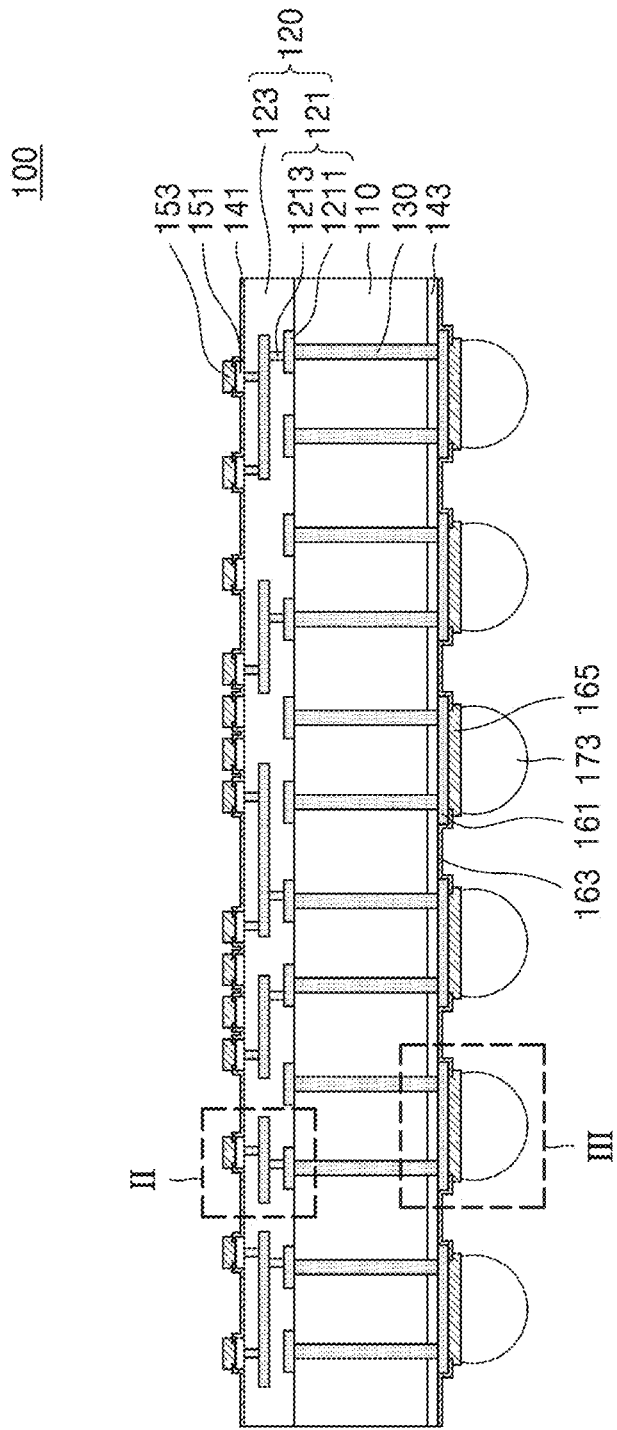
FIG. 1 is a cross-sectional view illustrating an interposer according to example embodiments of inventive concepts.

Hereinafter, embodiments of inventive concepts will be described in detail with reference to the accompanying drawings. Herein, like reference numerals will denote like elements, and redundant descriptions thereof will be omitted for conciseness.

Figure 2:
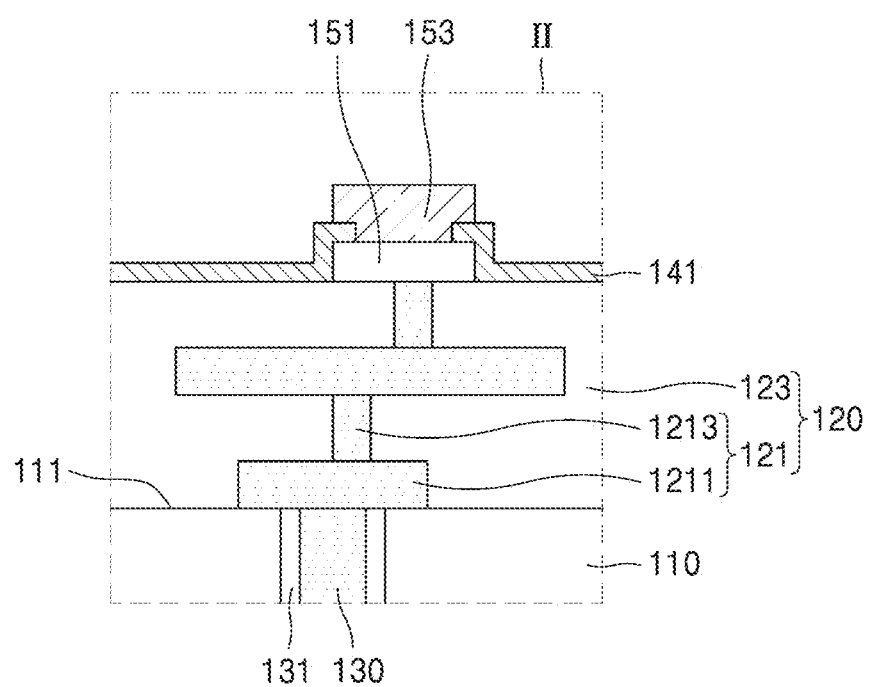
FIG. 2 is an enlarged view of a region "II" in FIG. 1.
Figure 3:
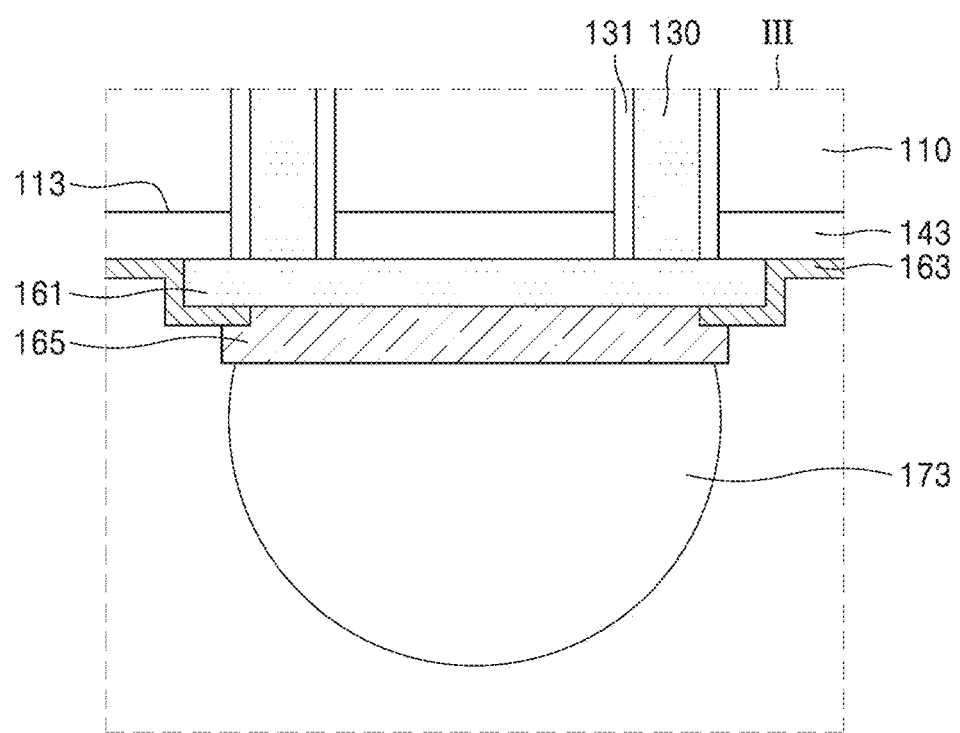
FIG. 3 is an enlarged view of a region "III" in FIG. 1.

FIG. 1 is a cross-sectional view illustrating an interposer 100 according to example embodiments of inventive concepts. FIG. 2 is an enlarged view of a region "II" in FIG. 1. FIG. 3 is an enlarged view of a region "III" in FIG. 1.

Referring to FIGS. 1 to 3, the interposer 100 may include a base substrate 110, an interconnection structure 120, and a through electrode 130.

The base substrate 110 may include a silicon wafer (Si wafer) including silicon (Si), for example, crystalline silicon, polycrystalline silicon, or amorphous silicon. The base substrate 110 may include a top surface 111 and a bottom surface 113 opposite to the top surface 111.

The interconnection structure 120 may be arranged on the top surface 111 of the base substrate 110. The interconnection structure 120 may include, for example, a back-end-of-line (BEOL) structure. The interconnection structure 120 may include an insulating layer 123 and a metal interconnection pattern 121 arranged in the insulating layer 123. The metal interconnection pattern 121 may include an interconnection layer 1211 and a conductive via 1213. The interconnection layer 1211 may include an interconnection barrier layer and an interconnection metal layer. The interconnection barrier layer may include at least one material selected from Ti, TiN, Ta, and TaN. The interconnection metal layer may include at least one metal selected from W, Al, and Cu. The interconnection layer 1211 may include the same material as that of the conductive via 1213. Alternatively, at least some of the interconnection layer 1211 and the conductive via 1213 may be configured to include different materials. The metal interconnection pattern 121 may have a multilayer structure including two or more interconnection layers 1211 and at least one conductive via 1213 connecting the two or more interconnection layers 1211.

The through electrode 130 may extend from the top surface 111 to the bottom surface 113 of the base substrate 110 and penetrate the base substrate 110. Also, the through electrode 130 may extend and further penetrate a lower passivation layer 143 arranged on the bottom surface 113 of the base substrate 110. An upper end of the through electrode 130 may be connected to the metal interconnection pattern 121 of the interconnection structure 120, and a lower end of the through electrode 130 may be connected to a lower conductive layer 161. The through electrode 130 may electrically connect the lower conductive layer 161 to the metal interconnection pattern 121 of the interconnection structure 120.

For example, the through electrode 130 may include a barrier layer formed on a columnar surface and a buried conductive layer filling the inside of the barrier layer. The barrier layer may include at least one material selected from Ti, TiN, Ta, TaN, Ru, Co, Mn, WN, Ni, and NiB, and the buried conductive layer may include at least one material selected from Cu, a Cu alloy such as CuSn, CuMg, CuNi, CuZn, CuPd, CuAu, CuRe, or CuW, W, a W alloy, Ni, Ru, and Co. A via insulating layer 131 may be between the base substrate 110 and the through electrode 130. The via insulating layer 131 may include an oxide layer, a nitride layer, a carbide layer, a polymer, or any combination thereof.

The interposer 100 may include a connection pad 151 arranged on the top surface of the interconnection structure 120 and an upper passivation layer 141 arranged on the top surface of the interconnection structure 120 and covering a portion of the connection pad 151.

The connection pad 151 may be arranged on the top surface of the interconnection structure 120 and may be electrically connected to the metal interconnection pattern 121 of the interconnection structure 120. The connection pad 151 may be electrically connected to the through electrode 130 through the metal interconnection pattern 121 of the interconnection structure 120. The connection pad 151 may include at least one of aluminum (Al), copper (Cu), nickel (Ni), tungsten (W), platinum (Pt), and gold (Au).

The upper passivation layer 141 may cover the top surface of the interconnection structure 120 and cover a portion of the connection pad 151. The upper passivation layer 141 may cover the top surface of the connection pad 151 and at least a portion of the sidewall of the connection pads 151. The upper passivation layer 141 may protect other structures such as the interconnection structure 120 from external impact and moisture. For example, the upper passivation layer 141 may include silicon, an oxide, a polymer, or any combination thereof. In some embodiments, the upper passivation layer 141 may include a silicon oxide, a silicon nitride, or a combination thereof. The upper passivation layer 141 may include an opening for exposing at least a portion of the top surface of the connection pad 151.

An upper connection pillar 153 may be formed on the connection pad 151 and the upper passivation layer 141. The upper connection pillar 153 may be a portion attached to a chip-interposer connection terminal (171 of FIG. 7) for connecting the interposer 100 to at least one semiconductor chip (see a first semiconductor chip 210 and/or a second semiconductor chip 220 of FIG. 7). The upper connection pillar 153 may include nickel (Ni), copper (Cu), palladium (Pd), platinum (Pt), gold (Au), or any combination thereof. In some cases, the upper connection pillar 153 may be omitted.

Meanwhile, although not illustrated in the drawings, an under bump metal layer may be further formed between the upper connection pillar 153 and the connection pad 151. The under bump metal layer may include a seed layer, an adhesive layer, or a barrier layer for forming the upper connection pillar 153. For example, the under bump metal layer may include chrome (Cr), tungsten (W), titanium (Ti), copper (Cu), nickel (Ni), aluminum (Al), palladium (Pd), gold (Au), or any combination thereof. Also, although not illustrated in the drawings, the upper connection pillar 153 may include a diffusion barrier layer for limiting and/or preventing excessive generation of an intermetallic compound, at a portion where the chip-interposer connection terminal 171 is joined. For example, the diffusion barrier layer may include nickel (Ni) or Ni alloy.

The interposer 100 may include the lower passivation layer 143 arranged on the bottom surface 113 of the base substrate 110. The lower passivation layer 143 may cover the bottom surface 113 of the base substrate 110 and cover a portion of the sidewall of the through electrode 130. The lower passivation layer 143 may protect other structures under the lower passivation layer 143 from external impact or moisture. For example, the lower passivation layer 143 may include an oxide, a nitride, a polymer, or any combination thereof. In some embodiments, the lower passivation layer 143 may include a silicon oxide, a silicon nitride, or a combination thereof. The lower passivation layer 143 may be under the base substrate 110 such that the bottom surface 113 of the base substrate 110 may be on the lower passivation layer 143.

The interposer 100 may include the lower conductive layer 161 arranged on the lower passivation layer 143 and a lower insulating layer 163 arranged on the lower passivation layer 143 and covering at least a portion of the lower conductive layer 161. The lower conductive layer 161 may be under the lower passivation layer 143 such that the lower passivation layer 143 may be on the lower conductive layer 161.

The lower conductive layer 161 may include a redistribution layer arranged on the lower passivation layer 143 and may be electrically connected to the through electrode 130. The lower conductive layer 161 may include at least one metal selected from tungsten (W), aluminum (Al), and copper (Cu).

The lower insulating layer 163 may be arranged on the lower passivation layer 143 and may cover at least a portion of the lower conductive layer 161. The lower insulating layer 163 may include an opening for exposing at least a portion of the lower conductive layer 161.

A lower connection pillar 165 may be formed on the lower conductive layer 161 and the lower insulating layer 163. The lower connection pillar 165 may be a portion attached to a board-interposer connection terminal 173 for connecting the interposer 100 to a board such as a printed circuit board (PCB). The lower connection pillar 165 may include nickel (Ni), copper (Cu), palladium (Pd), platinum (Pt), gold (Au), or any combination thereof. In some cases, the lower connection pillar 165 may be omitted.

In example embodiments, the upper passivation layer 141 may have compressive stress. The upper passivation layer 141 may include an insulating material to which compressive stress is applied. For example, the upper passivation layer 141 may include a silicon oxide, a silicon nitride, or a combination thereof. For example, the upper passivation layer 141 having compressive stress may be formed by a plasma-enhanced chemical vapor deposition (PECVD) process. In this case, in order to adjust the compressive stress of the upper passivation layer 141, the process condition of a PECVD process for forming the upper passivation layer 141 may be adjusted or the thickness of the upper passivation layer 141 may be adjusted.

In example embodiments, the compressive stress of the upper passivation layer 141 may be between about 150 MPa and about 250 MPa.

Also, in example embodiments, the thickness of the upper passivation layer 141 may be between about 1 µm and about 2 µm. Here, the thickness of the upper passivation layer 141 may be in a direction perpendicular to the top surface of the interconnection structure 120 or the top surface 111 of the base substrate 110.

Also, the lower passivation layer 143 may have compressive stress. The lower passivation layer 143 may include an insulating material to which compressive stress is applied. For example, the lower passivation layer 143 may include a silicon oxide, a silicon nitride, or a combination thereof. For example, the lower passivation layer 143 having compressive stress may be formed by a PECVD process. In this case, in order to adjust the compressive stress of the lower passivation layer 143, the process condition of a PECVD process for forming the lower passivation layer 143 may be adjusted or the thickness of the lower passivation layer 143 may be adjusted.

In example embodiments, the compressive stress of the lower passivation layer 143 may be between about 100 MPa and about 200 MPa.

Also, in example embodiments, the thickness of the lower passivation layer 143 may be between about 2 µm and about 3 µm. Here, the thickness of the lower passivation layer 143 may be in a direction perpendicular to the bottom surface 113 of the base substrate 110. In some embodiments, the thickness of the lower passivation layer 143 may be greater than the thickness of the upper passivation layer 141.

In example embodiments of inventive concepts, the upper passivation layer 141 and the lower passivation layer 143 may provide compressive stress opposite to tensile stress generated in the interposer 100. Here, when the tensile stress is stress having a positive value, the compressive stress may be stress having a negative value. The tensile stress generated in the interposer may be canceled (offset) or reduced by the compressive stress provided by each of the upper passivation layer 141 and the lower passivation layer 143. For example, the tensile stress generated due to a coefficient of thermal expansion (CTE) difference between the structures in the interposer 100 and the tensile stress generated in a metal interconnection portion arranged in the interposer 100 may be canceled by the compressive stress generated in the upper passivation layer 141 and the lower passivation layer 143. Because the upper passivation layer 141 and the lower passivation layer 143 cancel the tensile stress in the interposer 100 together, the warpage of the interposer 100 and the warpage of a semiconductor package manufactured by using the interposer 100 may be suppressed. Also, because a defect such as interconnection damage or damage of the chip-interposer connection terminal 171, caused by the warpage, may be limited and/or prevented, the reliability of the interposer 100 and the semiconductor package manufactured by using the interposer 100 may be improved.

In example embodiments, the upper passivation layer 141 may be formed to have compressive stress that is greater than the compressive stress of the lower passivation layer 143. For example, the difference between the compressive stress of the upper passivation layer 141 and the compressive stress of the lower passivation layer 143 may be between about 50 MPa and about 150 MPa. By performing the PECVD process for forming the upper passivation layer 141 at a higher temperature than the PECVD process for forming the lower passivation layer 143, the upper passivation layer 141 may be formed to have greater compressive stress than the lower passivation layer 143. In this case, because the upper passivation layer 141 is arranged adjacent to the interconnection structure 120 having a BEOL structure formed to generate a relatively great tensile stress, the tensile stress of the interconnection structure 120 may be effectively canceled by the upper passivation layer 141.

Figure 4A:
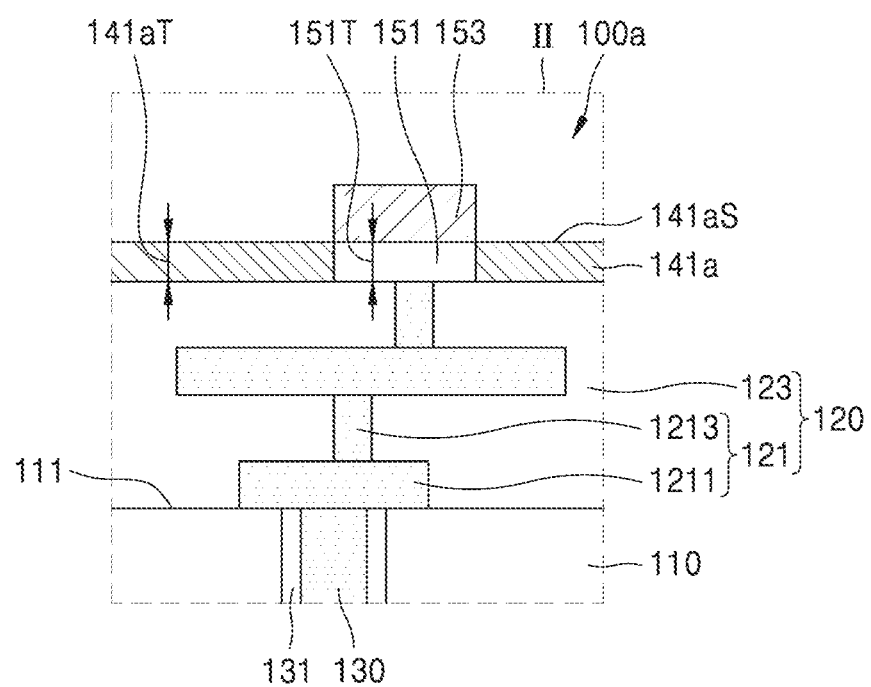
FIGS. 4A and 4B are cross-sectional views each illustrating a portion of an interposer according to example embodiments of inventive concepts.
Figure 4B:
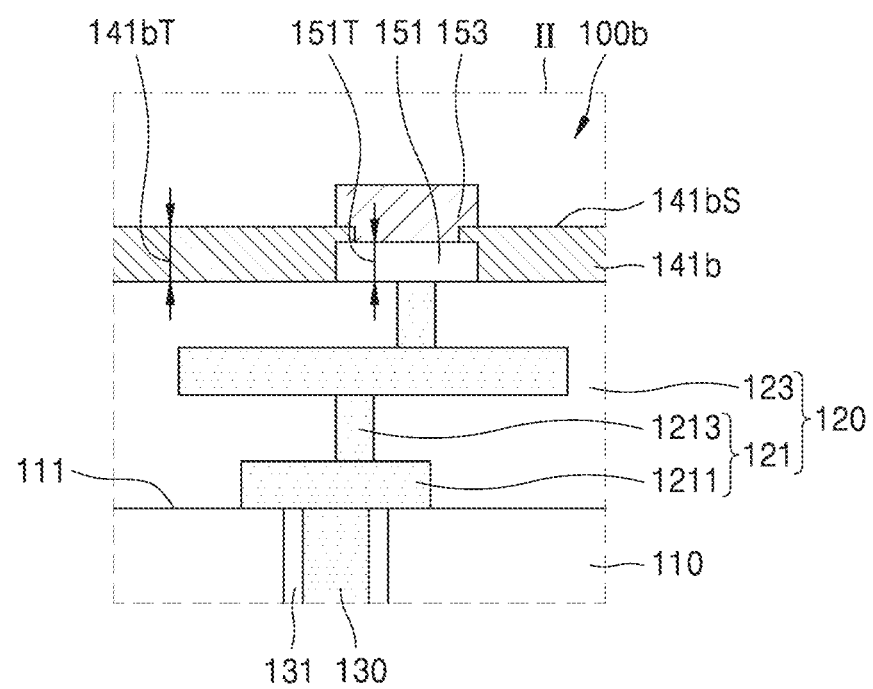

FIGS. 4A and 4B are cross-sectional views respectively illustrating portions of interposers 100*a* and 100*b* according to example embodiments of inventive concepts. FIGS. 4A and 4B each illustrate a portion corresponding to a region "II" in FIG. 1. The interposers 100*a* and 100*b* illustrated in FIGS. 4A and 4B may be substantially identical or similar to the interposer 100 described with reference to FIGS. 1 to 3, except for upper passivation layers 141*a* and 141*b*. Hereinafter, for convenience of description, differences from the interposer 100 described with reference to FIGS. 1 to 3 will be mainly described.

Referring to FIG. 4A, the upper passivation layer 141*a* may be formed to cover the top surface of the interconnection structure 120 and may cover a portion of the connection pad 151 arranged on the top surface of the interconnection structure 120.

In example embodiments, the upper passivation layer 141*a* may be formed to have a thickness equal to a thickness 151T of the connection pad 151. A thickness 141*a*T of the upper passivation layer 141*a* may be in a direction perpendicular to the top surface of the interconnection structure 120, and the thickness 151T of the connection pad 151 may be in a direction perpendicular to the top surface of the interconnection structure 120. For example, the thickness 141*a*T of the upper passivation layer 141*a* may be between about 3 µm and about 10 µm. As the upper passivation layer 141*a* is formed to a large thickness corresponding to the thickness 151T of the connection pad 151, the magnitude of the compressive stress of the upper passivation layer 141a may be increased.

When the thickness of the upper passivation layer 141a is formed to be equal to the thickness 151T of the connection pad 151, the upper passivation layer 141a may cover the sidewall of the connection pad 151 and a top surface 141aS of the upper passivation layer 141a may be at a level substantially equal to the level of the top surface of the connection pad 151.

In addition, the upper passivation layer 141a may have a bottom surface contacting the interconnection structure 120 and a top surface 141aS opposite to the bottom surface, and the top surface 141aS of the upper passivation layer 141a may be flat. For example, in order to form the upper passivation layer 141a, an insulating material covering the connection pad 151 may be formed on the top surface of the interconnection structure 120 and a chemical mechanical polishing (CMP) process may be performed on the insulating material. As a result of the CMP process, the upper passivation layer 141a may include a planarized top surface 141aS without a stepped portion.

Because the upper passivation layer 141a includes the planarized top surface 141aS, when a photomask layer used to form the connection pad 151 is applied onto the top surface 141aS of the upper passivation layer 141a, the photomask layer may be formed without a stepped portion and diffused reflection may be reduced in an exposure process on the photomask layer. Because the upper passivation layer 141a includes the planarized top surface 141aS, a dummy pad formed on the top surface 141aS of the upper passivation layer 141a may be uniformly formed in the same process operation as the connection pad 151.

Referring to FIG. 4B, a thickness 141bT of an upper passivation layer 141b may be greater than the thickness of the connection pad 151. In this case, the upper passivation layer 141b may cover a portion of the top surface and the sidewall of the connection pad 151, and the top surface 141bS of the upper passivation layer 141b may be at a higher level than the top surface of the connection pad 151. As the upper passivation layer 141b is formed to have a large thickness greater than the thickness 151T of the connection pad 151, the magnitude of the compressive stress of the upper passivation layer 141b may increase.

For example, in order to form the upper passivation layer 141b, an insulating material covering the connection pad 151 may be formed on the top surface of the interconnection structure 120 and a CMP process may be performed such that the insulating material has a planarized surface. Thereafter, the upper passivation layer 141b may be formed by further performing a patterning process on the planarized insulating material to expose a portion of the connection pad 151.

Figure 5:
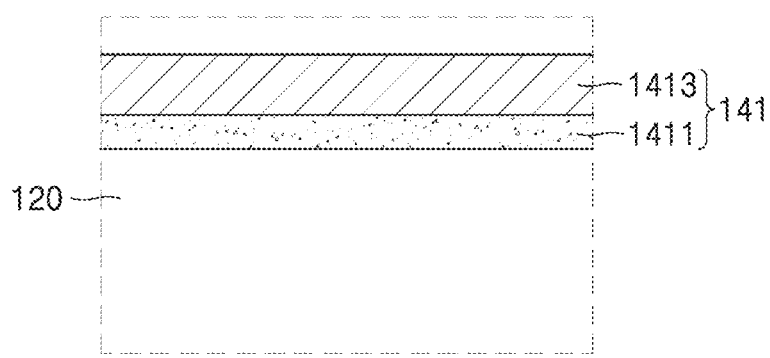
FIG. 5 is a cross-sectional view illustrating a structure of an upper passivation layer of an interposer according to example embodiments of inventive concepts.

FIG. 5 is a cross-sectional view illustrating a structure of an upper passivation layer 141 of an interposer 100 according to example embodiments of inventive concepts.

Referring to FIG. 5 together with FIGS. 1 to 3, the upper passivation layer 141 may have a multilayer structure in which a plurality of insulating layers are stacked. For example, the upper passivation layer 141 may have a multilayer structure including a silicon oxide layer and a silicon nitride layer. For example, the upper passivation layer 141 may include a first layer 1411 arranged on the interconnection structure 120 and a second layer 1413 arranged on the first layer 1411 and including a different material than the first layer 1411.

In example embodiments, the first layer 1411 of the upper passivation layer 141 may include a silicon oxide with excellent adhesion. In this case, the adhesion between the upper passivation layer 141 and the interconnection structure 120 may be enhanced.

Also, in example embodiments, the second layer 1413 of the upper passivation layer 141 may include a silicon nitride to which relatively great compressive stress may be easily applied through a PECVD process.

Figure 6:
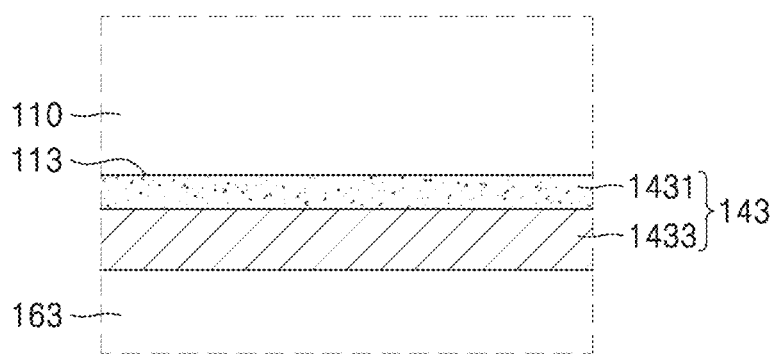
FIG. 6 is a cross-sectional view illustrating a structure of a lower passivation layer of an interposer according to example embodiments of inventive concepts.

FIG. 6 is a cross-sectional view illustrating a structure of a lower passivation layer 143 of an interposer 100 according to example embodiments of inventive concepts.

Referring to FIG. 6 together with FIGS. 1 to 3, the lower passivation layer 143 may have a multilayer structure in which a plurality of insulating layers are stacked. For example, the lower passivation layer 143 may have a multilayer structure including a silicon oxide layer and a silicon nitride layer. For example, the lower passivation layer 143 may include a first layer 1431 arranged on the bottom surface 113 of the base substrate 110 and a second layer 1433 arranged on the first layer 1431 and including a different material than the first layer 1431.

In example embodiments, the first layer 1431 of the lower passivation layer 143 may include a silicon oxide with excellent adhesion. In this case, the adhesion between the lower passivation layer 143 and the bottom surface 113 of the base substrate 110 may be enhanced.

Also, in example embodiments, the second layer 1433 of the lower passivation layer 143 may include a silicon nitride to which relatively great compressive stress may be easily applied through a PECVD process.

Figure 7:
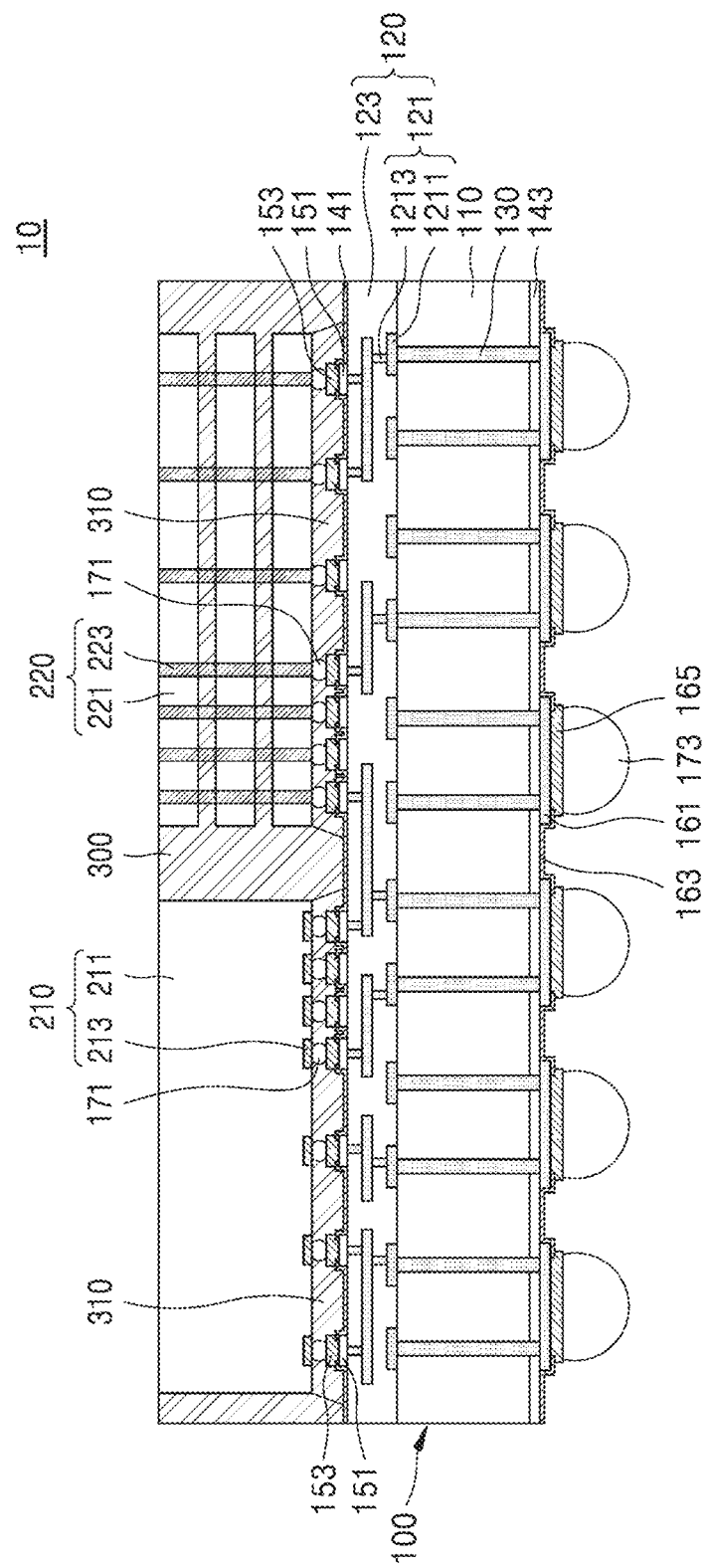
FIG. 7 is a cross-sectional view illustrating a semiconductor package according to example embodiments of inventive concepts.

FIG. 7 is a cross-sectional view illustrating a semiconductor package 10 according to example embodiments of inventive concepts.

Referring to FIG. 7, the semiconductor package 10 may include an interposer 100 and at least one semiconductor chip mounted on the interposer 100. Although FIG. 7 illustrates that the semiconductor package 10 includes the interposer 100 described with reference to FIGS. 1 to 3, the semiconductor package 10 may include the interposers 100a and 100b described with reference to FIGS. 4A and 4B.

The at least one semiconductor chip may include a first semiconductor chip 210 and a second semiconductor chip 220 mounted on the interposer 100. The first semiconductor chip 210 and the second semiconductor chip 220 may be horizontally spaced apart from each other on the interposer 100. Although FIG. 7 illustrates that two semiconductor chips are mounted on the interposer 100, the semiconductor package 10 may include three or more semiconductor chips arranged on the interposer 100.

The first semiconductor chip 210 may be implemented as a logic chip such as a microprocessor, a graphics processor, a signal processor, a network processor, a chipset, an audio codec, a video codec, an application processor, or a system-on-chip but is not limited thereto.

The first semiconductor chip 210 may include a semiconductor substrate 211 having an active surface and an inactive surface opposite to the active surface. The first semiconductor chip 210 may include a first chip pad 213 on the bottom surface of the semiconductor substrate 211. The first chip pad 213 may be connected to a logic device (not illustrated) of the first semiconductor chip 210 through an interconnection structure (not illustrated).

The first chip pads 213 of the first semiconductor chip 210 may be electrically connected through a chip-interposer connection terminal 171 to a connection pad 151 arranged on the top surface of the interposer 100. The first chip pad 213 of the first semiconductor chip 210 and the connection pad 151 of the interposer 100 may be used as a terminal for transmitting input/output data signals of the first semiconductor chip 210 or a terminal for the power and/or ground of the first semiconductor chip 210. In FIG. 7, the number and arrangement of first chip pads 213 of the first semiconductor chip 210 and connection pads 151 of the interposer 100 are illustrated as an example.

The second semiconductor chip 220 may include a high-bandwidth memory chip. In some embodiments, the second semiconductor chip 220 may include a volatile memory chip and/or a nonvolatile memory chip. The volatile memory chip may include, for example, dynamic random access memory (DRAM), static RAM (SRAM), thyristor RAM (TRAM), zero-capacitor RAM (ZRAM), or twin transistor RAM (TTRAM). Also, the nonvolatile memory chip may include, for example, a flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or an insulator resistance change memory.

The second semiconductor chip 220 may include a stack of a plurality of memory chips capable of data merging therebetween. Each of the memory chips constituting the second semiconductor chip 220 may include a semiconductor substrate 221 having an active surface and an inactive surface facing each other, a memory device (not illustrated) formed on the active surface, and a through silicon via (TSV) 223 penetrating the semiconductor substrate 221. In some embodiments, in the stack of a plurality of memory chips, the lowermost memory chip may be a buffer chip including a serial-parallel conversion circuit, and each of the other semiconductor chips may be a DRAM semiconductor chip.

Although FIG. 7 illustrates that the semiconductor package 10 includes one first semiconductor chip 210 and one second semiconductor chip 220, the number of first semiconductor chips 210 and second semiconductor chips 220 is not limited thereto. For example, the semiconductor package 10 may include two or more second semiconductor chips 220. For example, two second semiconductor chips 220 may be apart from each other with the first semiconductor chip 210 therebetween.

The second semiconductor chip 220 may include, on a bottom surface thereof, a second chip pad (not illustrated) connected to the TSV 223 of the second semiconductor chip 220. The second semiconductor chip 220 may be connected to the chip-interposer connection terminal 171 through the second chip pad. The TSV 223 of the second semiconductor chip 220 may be electrically connected to the connection pad 151 of the interposer 100 through the chip-interposer connection terminal 171. The TSV 223 of the second semiconductor chip 220 and the connection pad 151 of the interposer 100 may be used as a terminal for transmitting input/output data signals of the second semiconductor chip 220 or a terminal for the power and/or ground of the second semiconductor chip 220. In FIG. 7, the number and arrangement of TSVs of the second semiconductor chip 220 and connection pads 151 of the interposer 100 are illustrated as an example.

In a system-in-package in which a plurality of individual semiconductor chips are integrated into one package, the number of memory chips constituting the second semiconductor chip 220 may vary depending on the purpose of the semiconductor package 10. That is, the number of memory chips constituting the second semiconductor chip 220 is not limited to the number illustrated in the drawings. The memory chips constituting the second semiconductor chip 220 may be adhered and stacked onto each other through an adhesive member (not illustrated). The adhesive member may include a die attach film.

The interposer 100 may transmit electrical signals between an external device and the first and second semiconductor chips 210 and 220. For example, the interposer 100 may provide an electrical connection path for transmitting input/output data between the external device and the first and second semiconductor chips 210 and 220 and an electrical connection path for providing the power and ground for driving the first and second semiconductor chips 210 and 220. Also, the interposer 100 may transmit electrical signals between the first semiconductor chip 210 and the second semiconductor chip 220. For example, the first semiconductor chip 210 and the second semiconductor chip 220 may transmit data signals therebetween through the interposer 100.

In some embodiments, the interposer 100 may further include a circuit region (not illustrated), and a buffer circuit capable of controlling the capacitance loading of at least one semiconductor chip arranged on the interposer 100 may be formed in the circuit region. In other embodiments, a semiconductor integrated circuit including at least one selected from a transistor, a diode, a capacitor, and a resistor may be formed in the circuit region. In some cases, the circuit region may be omitted.

An underfill material layer 310 covering the chip-interposer connection terminal 171 may fill a space between the interposer 100 and the first semiconductor chip 210 and a space between the interposer 100 and the second semiconductor chip 220. For example, the underfill material layer 310 may include an epoxy resin formed in a capillary underfill process. In some embodiments, the underfill material layer 310 may include a nonconductive film.

The semiconductor package 10 may include a molding unit 300 covering at least a portion of the first semiconductor chip 210 and at least a portion of the second semiconductor chip 220. The molding unit 300 may cover at least a portion of the first semiconductor chip 210 and at least a portion of the second semiconductor chip 220 to protect the first semiconductor chip 210 and the second semiconductor chip 220 from the external environment.

The molding unit 300 may be formed by injecting a suitable amount of molding resin onto the interposer 100 by an injection process and curing the molding material through a curing process. The molding unit 300 may be a portion forming the outer shape of the semiconductor package 10. In some embodiments, the molding resin may include, for example, an epoxy-group molding resin or a polyimide-group molding resin.

As illustrated in FIG. 7, in example embodiments, the molding unit 300 may cover the side surface of the first semiconductor chip 210 and the side surface of the second semiconductor chip 220 and expose the top surface of the first semiconductor chip 210 and the top surface of the second semiconductor chip 220. Alternatively, in other example embodiments, the molding unit 300 may further cover the top surface of the first semiconductor chip 210 and the top surface of the second semiconductor chip 220.

As described above, the interposer 100 may include an upper passivation layer 141 and a lower passivation layer 143 having compressive stress, and the upper passivation layer 141 and the lower passivation layer 143 may cancel or reduce the tensile stress in the interposer 100 to suppress the warpage of the interposer 100. Also, according to the related art, as warpage may occur in a semiconductor package including a general large-area interposer, it may degrade the joint reliability between an interposer and a semiconductor chip due to damage to an interconnection and damage to a connection terminal and degrade the joint reliability between an interposer and a board due to damage to a connection terminal. However, according to the example embodiments of inventive concepts, because the semiconductor package 10 is formed by using the large-area interposer 100 with suppressed warpage, defects such as damage to the interconnection due to warpage, damage to the chip-interposer connection terminal 171, and damage to the board-interposer connection terminal 173 may be limited and/or prevented. Thus, the semiconductor package 10 may have excellent reliability.

Figure 8:
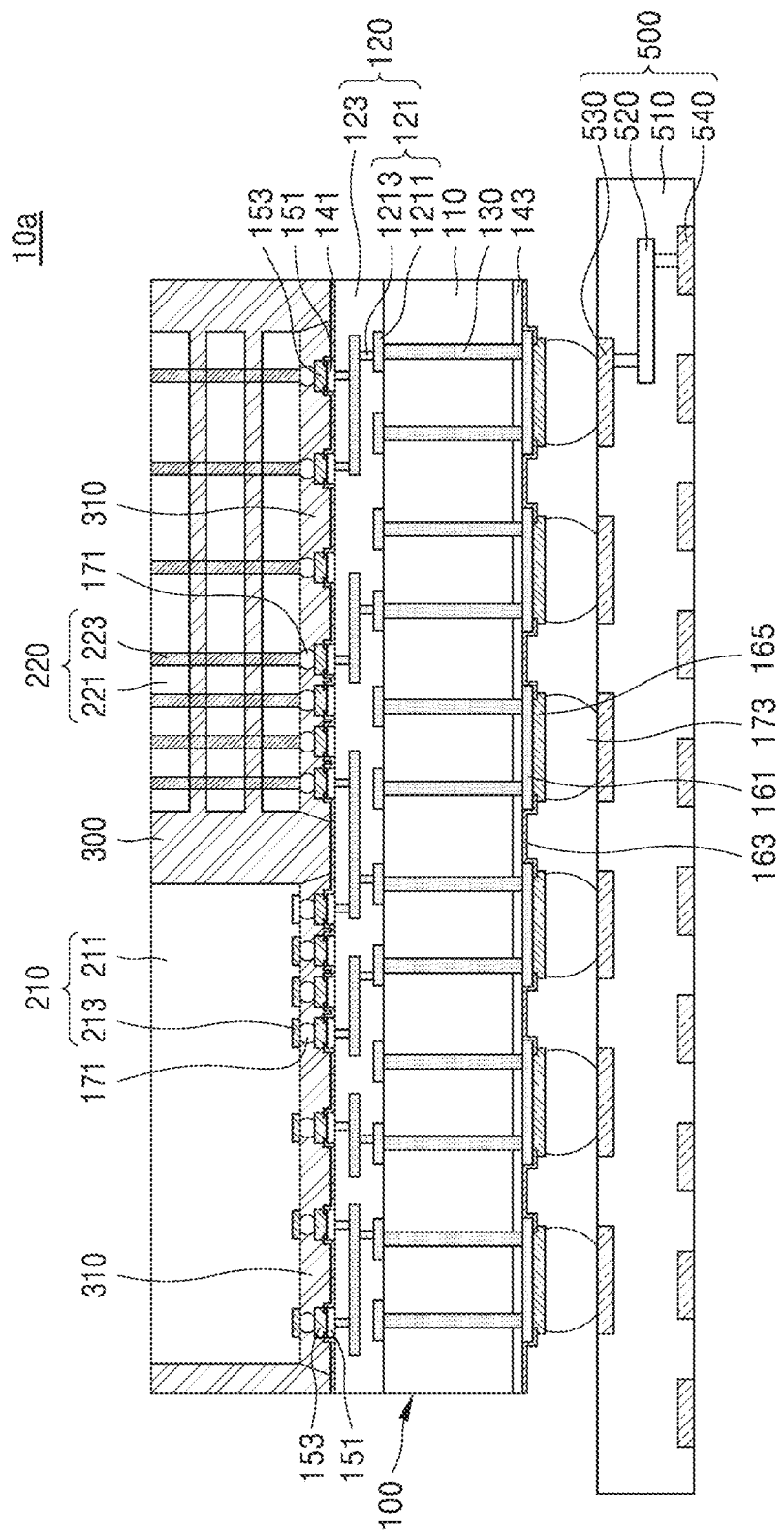
FIG. 8 is a cross-sectional view illustrating a semiconductor package according to example embodiments of inventive concepts.

FIG. 8 is a cross-sectional view illustrating a semiconductor package 10*a* according to example embodiments of inventive concepts. The semiconductor package 10*a* illustrated in FIG. 8 may be substantially identical or similar to the semiconductor package 10 illustrated in FIG. 7, except that the semiconductor package 10*a* further includes a package substrate 500. Hereinafter, for convenience of description, differences from the semiconductor package 10 described in FIG. 7 will be mainly described.

Referring to FIG. 8, the semiconductor package 10*a* may include an interposer 100, at least one semiconductor chip mounted on the interposer 100, and the package substrate 500 arranged under the interposer 100.

The package substrate 500 may include an upper substrate pad 530 on the top surface thereof and a lower substrate pad 540 on the bottom surface of the package substrate 500. Also, the package substrate 500 may include an internal interconnection 520 electrically connecting the upper substrate pad 530 to the lower substrate pad 540. The package substrate 500 may include a PCB. However, the package substrate 500 is not limited to a PCB.

The package substrate 500 may include a body unit 510 including at least one material selected from phenol resin, epoxy resin, and polyimide. The upper substrate pad 530, the lower substrate pad 540, and the internal interconnection 520 may include, for example, copper (Cu), nickel (Ni), aluminum (Al), or beryllium copper.

The package substrate 500 may be electrically/physically connected to the interposer 100 through the board-interposer connection terminal 173. Also, the package substrate 500 may be electrically connected through the interposer 100 to the first semiconductor chip 210 and the second semiconductor chip 220 mounted on the interposer 100.

FIGS. 9A to 9H are cross-sectional views illustrating a method of manufacturing an interposer according to example embodiments of inventive concepts. A method of manufacturing the interposer 100 illustrated in FIGS. 1 to 3 will be described with reference to FIGS. 9A to 9H.

Figure 9A:
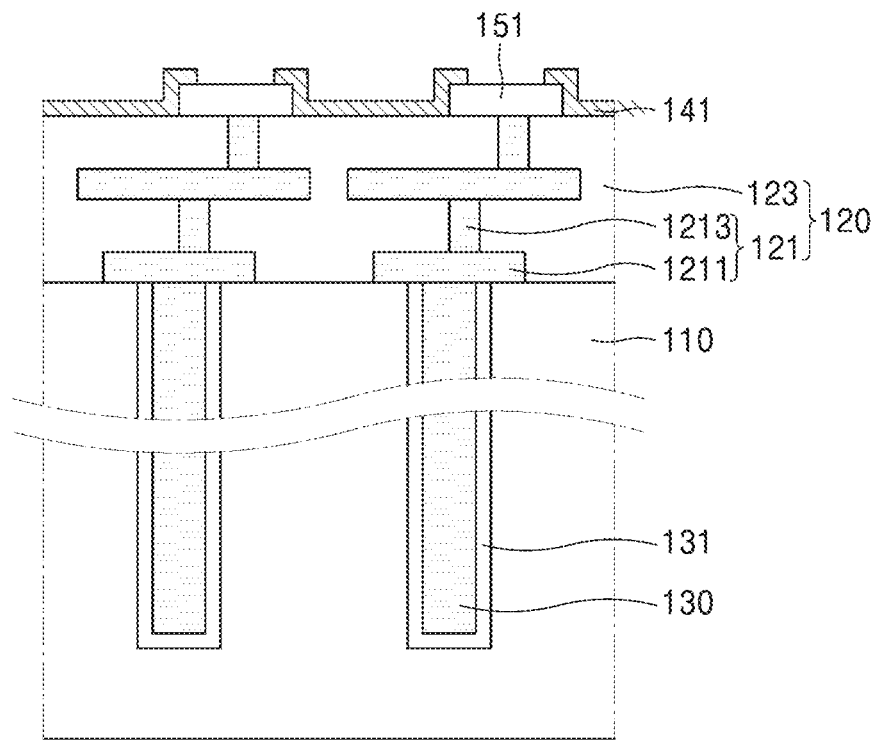
FIGS. 9A to 9H are cross-sectional views illustrating a method of manufacturing an interposer, according to example embodiments of inventive concepts.

Referring to FIG. 9A, a base substrate 110 with a through electrode 130 formed therein may be attached onto a carrier substrate (not illustrated), and an interconnection structure 120 including a metal interconnection pattern 121 of a multilayer and an insulation layer 123 covering the metal interconnection pattern 121 may be formed on a top surface 111 of the base substrate 110. In some embodiments, a damascene process may be performed to form the metal interconnection pattern 121 of the interconnection structure 120. For example, an insulating layer may be formed on the top surface 111 of the base substrate 110, an interconnection hole may be formed by patterning the insulating layer, and a metal interconnection pattern 121 including a conductive material may be formed in the interconnection hole.

After the interconnection structure 120 is formed, a connection pad 151 may be formed on the interconnection structure 120. For example, the connection pad 151 may be formed by forming a conductive layer on the interconnection structure 120 and patterning the conductive layer. The connection pad 151 may include Al, Ni, Cu, or any combination thereof.

After the connection pad 151 is formed, an upper passivation layer 141 may be formed on the interconnection structure 120. The upper passivation layer 141 may be formed to cover the top surface of the interconnection structure 120 and cover a portion of the connection pad 151. The upper passivation layer 141 may be formed to have an opening exposing at least a portion of the connection pad 151.

For example, a PECVD process may be performed to form the upper passivation layer 141. During the PECVD process, process conditions such as temperature and pressure may be controlled to control the compressive stress applied to the upper passivation layer 141. In some embodiments, the upper passivation layer 141 may be formed by using a silicon oxide, a silicon nitride, or a combination thereof. As described above with reference to FIG. 5, in order to form the upper passivation layer 141, a first layer (1411 of FIG. 5) including a silicon oxide may be formed on the top surface of the interconnection structure 120, and a second layer (1413 of FIG. 5) including a silicon nitride may be formed on the first layer 1411.

Figure 9B:
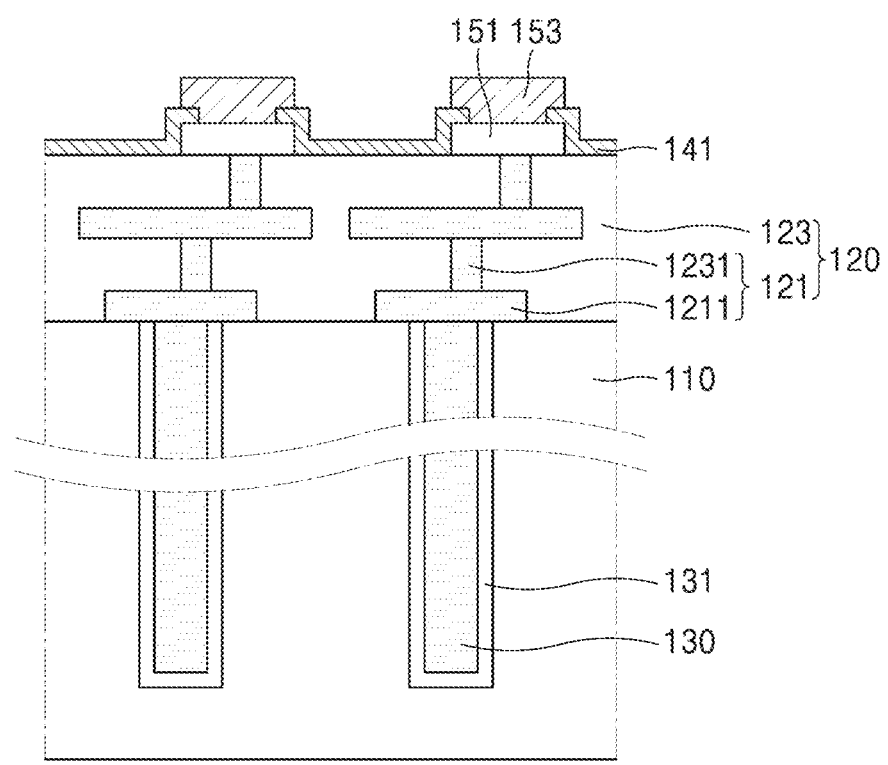

Referring to FIG. 9B, after the upper passivation layer 141 is formed, an upper connection pillar 153 electrically connected to the connection pad 151 exposed through the upper passivation layer 141 may be formed. For example, in order to form the upper connection pillar 153, a seed metal layer (not illustrated) may be formed on the connection pad 151 and the upper passivation layer 141, a mask pattern exposing a portion where the upper connection pillar 153 is formed may be formed, a conductive material layer may be formed through a plating process using the seed metal layer as a seed, and the mask pattern and a seed metal layer portion under the mask pattern may be removed.

Figure 9C:
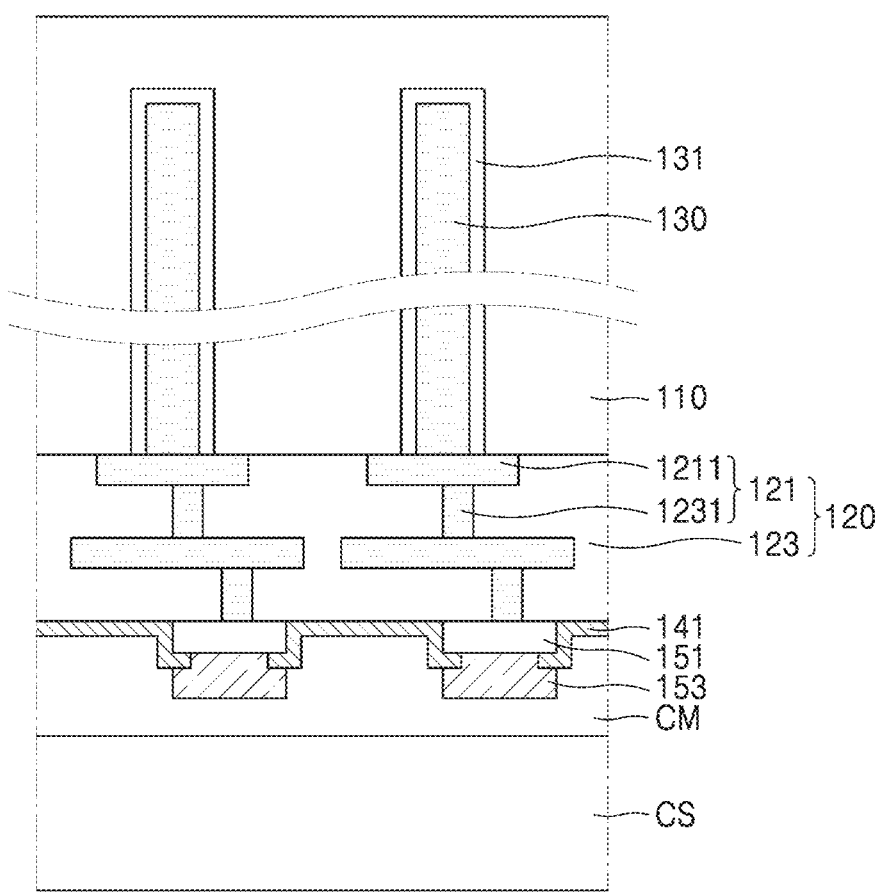

Referring to FIG. 9C, a carrier substrate CS may be attached onto the resulting structure of FIG. 9B. The carrier substrate CS may be attached to the upper passivation layer 141 and the upper connection pillar 153 through an adhesive material layer CM.

Figure 9D:
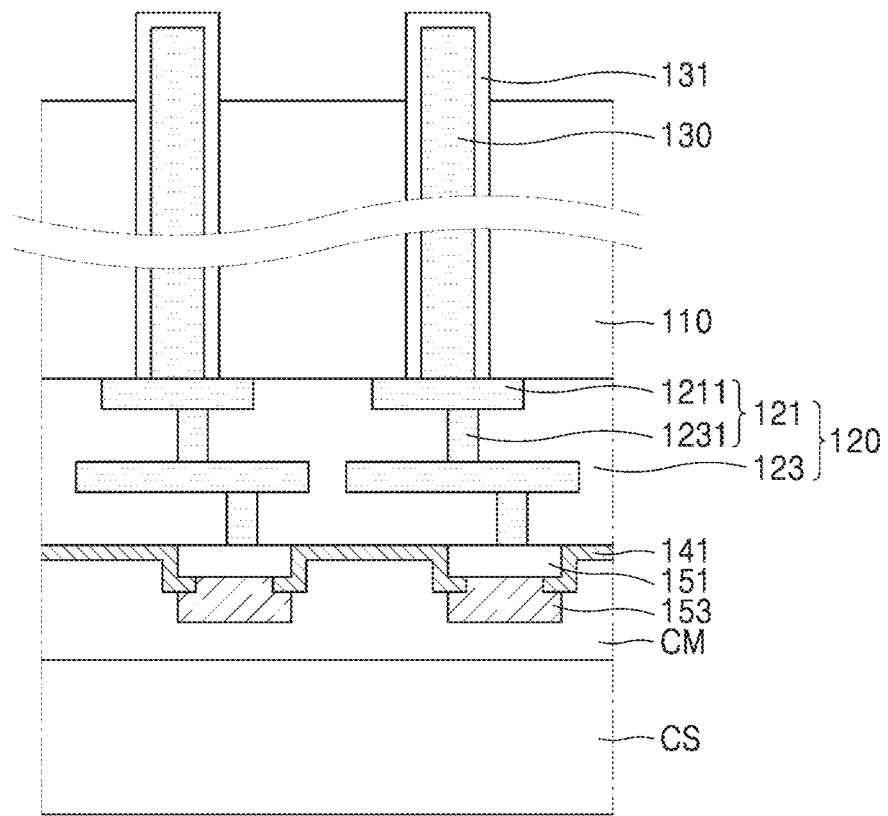

Referring to FIG. 9D, a portion of the base substrate 110 may be removed to expose the through electrode 130. The through electrode 130 may be exposed through the bottom surface 113 of the base substrate 110, and the through electrode 130 may penetrate the base substrate 110. Alternatively, a portion of the base substrate 110 may be removed such that the through electrode 130 protrudes from the base substrate 110.

Figure 9E:
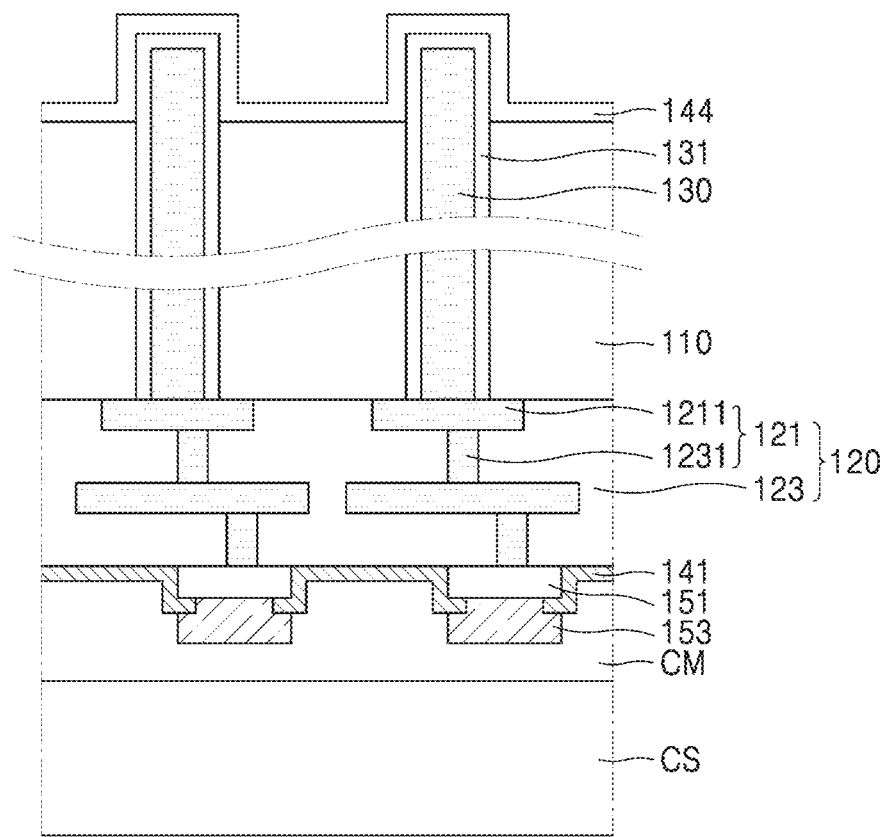

Referring to FIG. 9E, a lower passivation layer 144 covering the bottom surface 113 of the base substrate 110 may be formed. The lower passivation layer 144 may be formed to cover the through electrode 130 protruding from the base substrate 110.

For example, a PECVD process may be performed to form the lower passivation layer 144. During the PECVD process, process conditions such as temperature and pressure may be controlled to control the compressive stress applied to the lower passivation layer 144. In some embodiments, the lower passivation layer 144 may be formed by using a silicon oxide, a silicon nitride, or a combination thereof. As described above with reference to FIG. 6, in order to form the lower passivation layer 144, a first layer (1431 of FIG. 6) including a silicon oxide may be formed on the bottom surface 113 of the base substrate 110, and a second layer (1433 of FIG. 6) including a silicon nitride may be formed on the first layer 1431.

In example embodiments, in order to limit and/or prevent degradation of the adhesive material layer CM, the PECVD process for forming the lower passivation layer 144 may be performed at a lower temperature than the PECVD process for forming the upper passivation layer 141. As a result of the PECVD process performed at a low temperature, the lower passivation layer 144 may be formed to have compressive stress that is less than the compressive stress of the upper passivation layer 141.

Also, in example embodiments, the PECVD process for forming the lower passivation layer 144 may be performed at a low temperature, wherein the thickness of the lower passivation layer 144 may be increased to increase the compressive stress of the lower passivation layer 144. In some embodiments, the thickness of the lower passivation layer 144 may be greater than the thickness of upper passivation layer 141. In some embodiments, the thickness of the lower passivation layer 144 may be greater than the thickness of the upper passivation layer 141 by about 1 μm to about 2 μm.

Figure 9F:
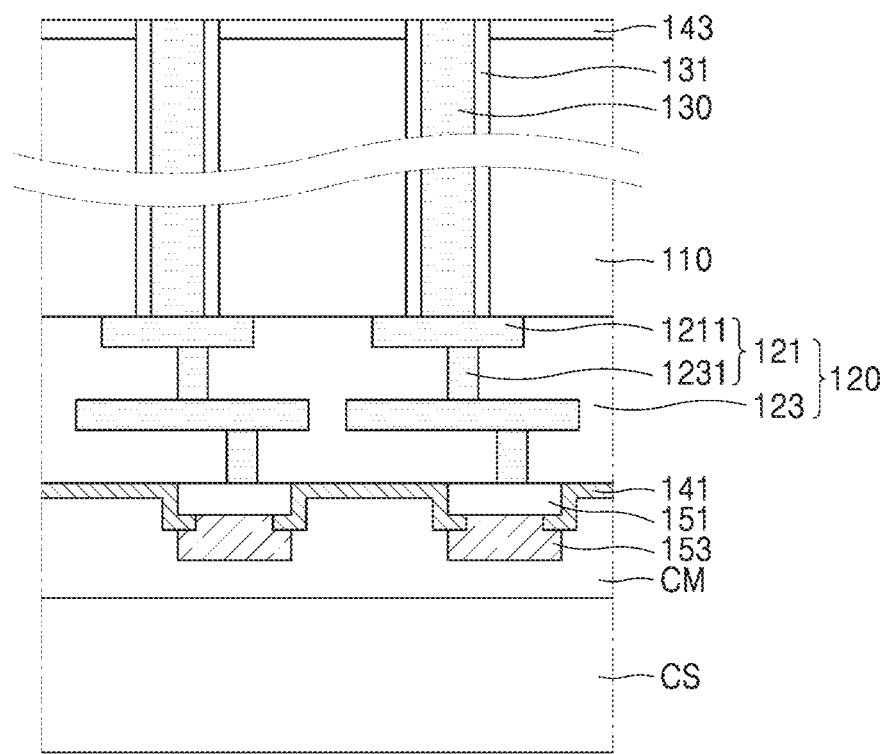

Referring to FIG. 9F, a polishing process may be performed from the exposed surface of the lower passivation layer (144 of FIG. 9E) until a planarized surface is obtained on the bottom surface side of the base substrate 110. For example, in order to obtain the planarized surface, an etch-back process, a CMP process, or the like may be performed. By the polishing process, the bottom surface of the planarized through electrode 130 may be exposed and the lower passivation layer 143 may cover the sidewall of the through electrode 130. The bottom surface of the through electrode 130 may be coplanar with the planarized surface of the lower passivation layer 143.

Figure 9G:
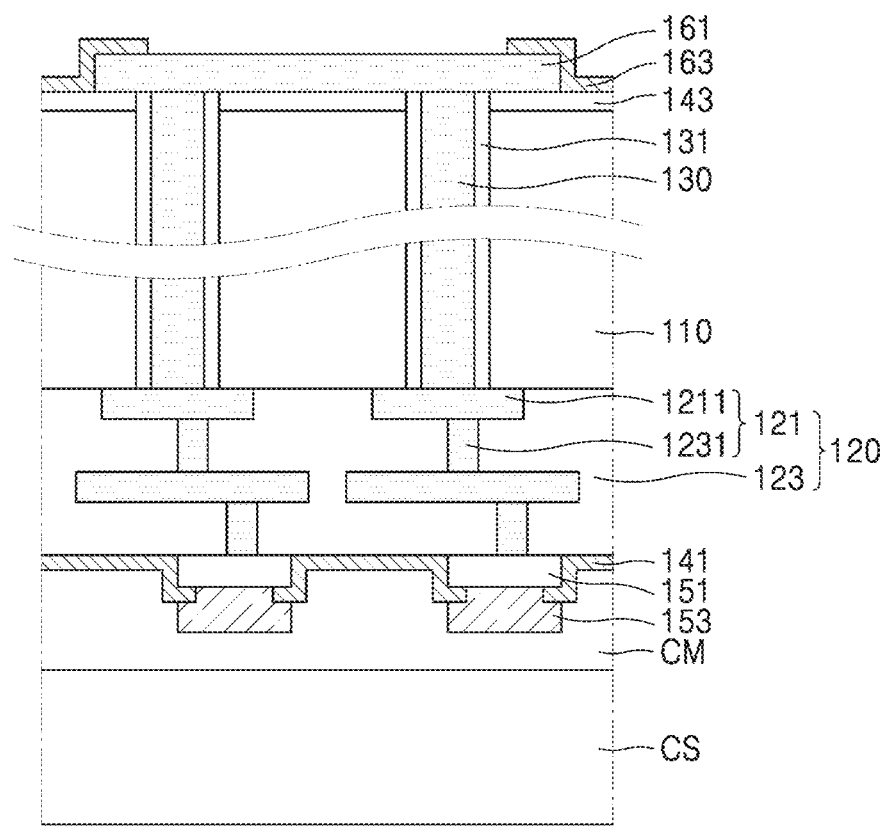

Referring to FIG. 9G, a lower conductive layer 161 and a lower insulating layer 163 electrically connected to the through electrode 130 may be formed on the lower passivation layer 143 and the through electrode 130. The lower conductive layer 161 may be formed to contact the bottom surface of the through electrode 130 exposed through the lower passivation layer 143. The lower insulating layer 163 may be formed by forming a conductive layer on the lower passivation layer 143 and patterning the conductive layer. The lower insulating layer 163 may be formed on the lower passivation layer 143 and may be formed to cover at least a portion of the lower conductive layer 161. The lower passivation layer 143 may be formed to have an opening exposing at least a portion of the lower conductive layer 161.

Figure 9H:
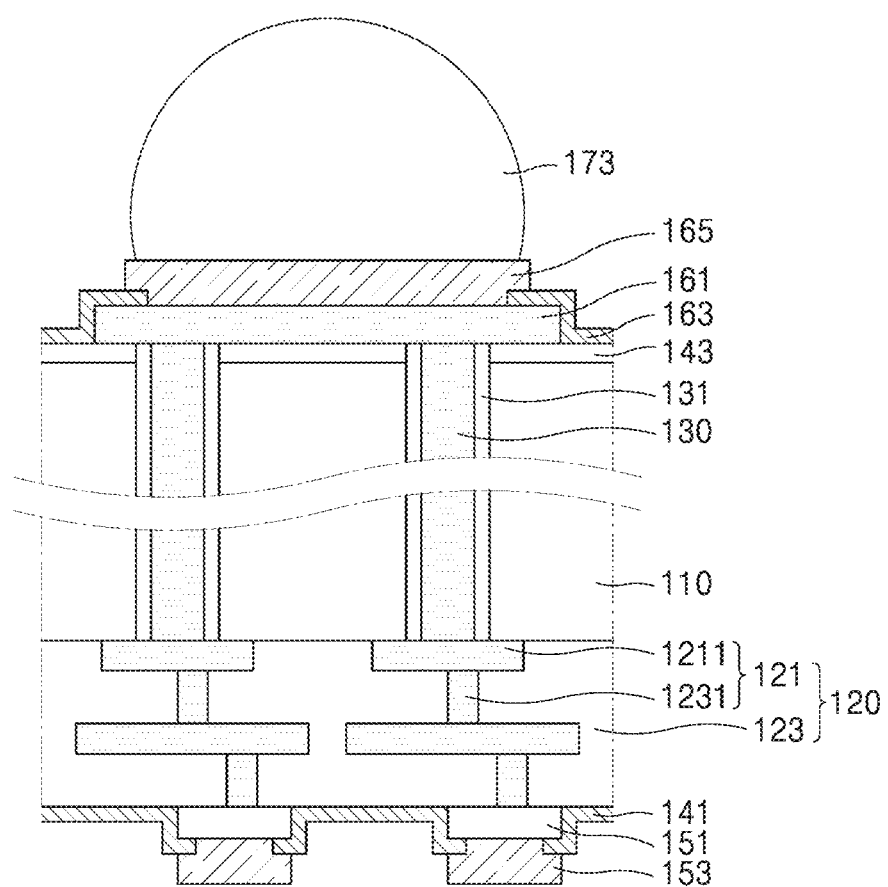

Referring to FIG. 9H, a lower connection pillar 165 electrically connected to the lower conductive layer 161 exposed through the lower insulating layer 163 may be formed, and a board-interposer connection terminal 173 may be formed on the lower connection pillar 165. In example embodiments, the board-interposer connection terminal 173 may be formed of a solder ball. The solder ball may be formed in a spherical shape and attached to the lower conductive layer 161 exposed through the lower insulating layer 163. Alternatively, in example embodiments, the board-interposer connection terminal 173 may be formed of a solder bump.

Figure 10A:
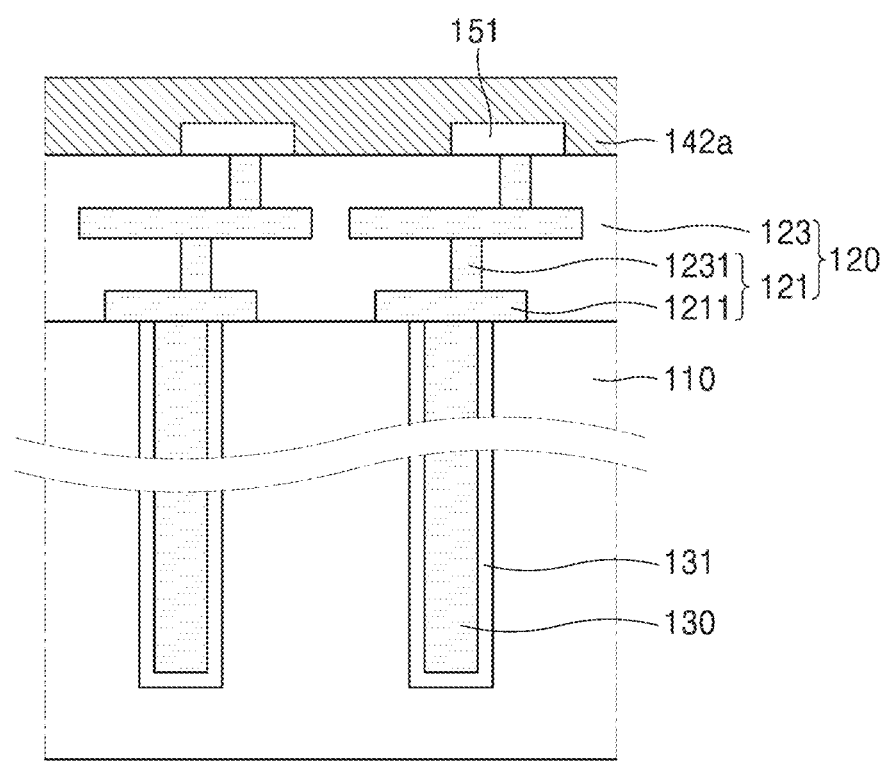
FIGS. 10A and 10B are cross-sectional views illustrating a method of manufacturing an interposer, according to example embodiments of inventive concepts.
Figure 10B:
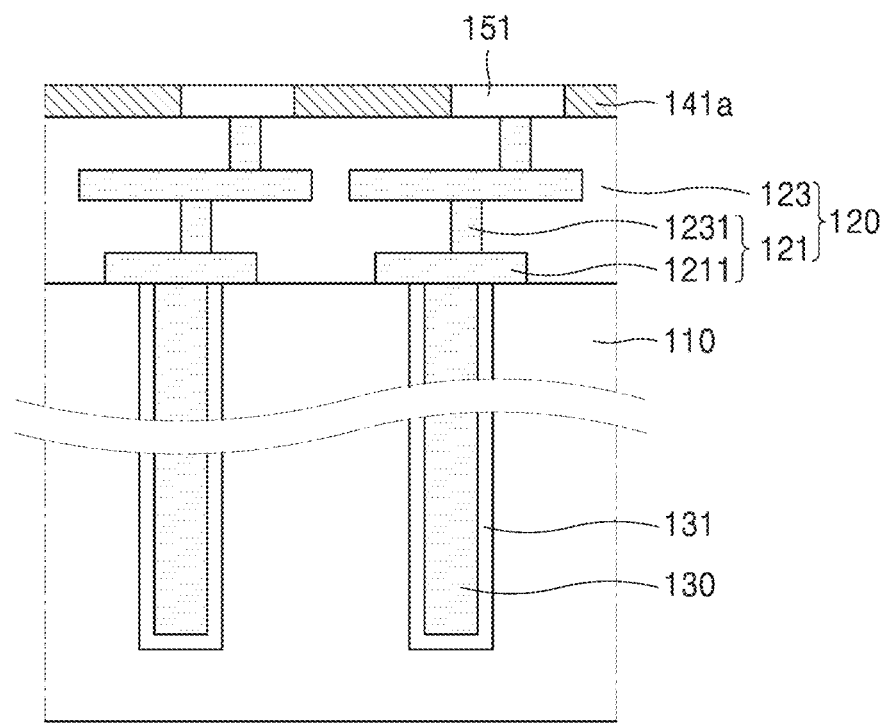

FIGS. 10A and 10B are cross-sectional views illustrating a method of manufacturing an interposer according to example embodiments of inventive concepts. A method of manufacturing the interposer 100a illustrated in FIG. 4A will be described with reference to FIGS. 10A and 10B. Hereinafter, redundant descriptions with those described above with reference to FIGS. 9A to 9H will be omitted or simplified.

Referring to FIG. 10A, a base substrate 110 with a through electrode 130 formed therein may be attached onto a carrier substrate (not illustrated), and an interconnection structure 120 and a connection pad 151 may be formed on a top surface 111 of the base substrate 110.

After the connection pad 151 is formed, a preliminary upper passivation layer 142a may be formed on the interconnection structure 120. The preliminary upper passivation layer 142a may be formed to cover the connection pad 151. For example, the preliminary upper passivation layer 142a may be formed by performing a PECVD process, and the process condition of the PECVD process may be controlled to control the compressive stress applied to the preliminary upper passivation layer 142a.

Referring to FIG. 10B, a portion of the preliminary upper passivation layer (142a of FIG. 10A) may be removed to form an upper passivation layer 141a. A portion of the preliminary upper passivation layer 142a may be removed by using a CMP process, and the upper passivation layer 141a may have a planarized top surface as a result of the CMP process. In example embodiments, by removing a portion of the preliminary upper passivation layer 142a until the connection pad 151 is exposed, the upper passivation layer 141a may be formed to have the same thickness as the connection pad 151.

Alternatively, in other example embodiments, the upper passivation layer (see 141b of FIG. 4B) may be formed thicker than the connection pad 151, as in the interposer 100b illustrated in FIG. 4B. In order to form the upper passivation layer 141b illustrated in FIG. 4B, a CMP process may be performed on the preliminary upper passivation layer 142a may be performed, wherein the CMP process may not expose the connection pad 151. After the CMP process, a patterning process may be further performed to expose a portion of the connection pad 151 to form the upper passivation layer 141b.

Figure 11A:
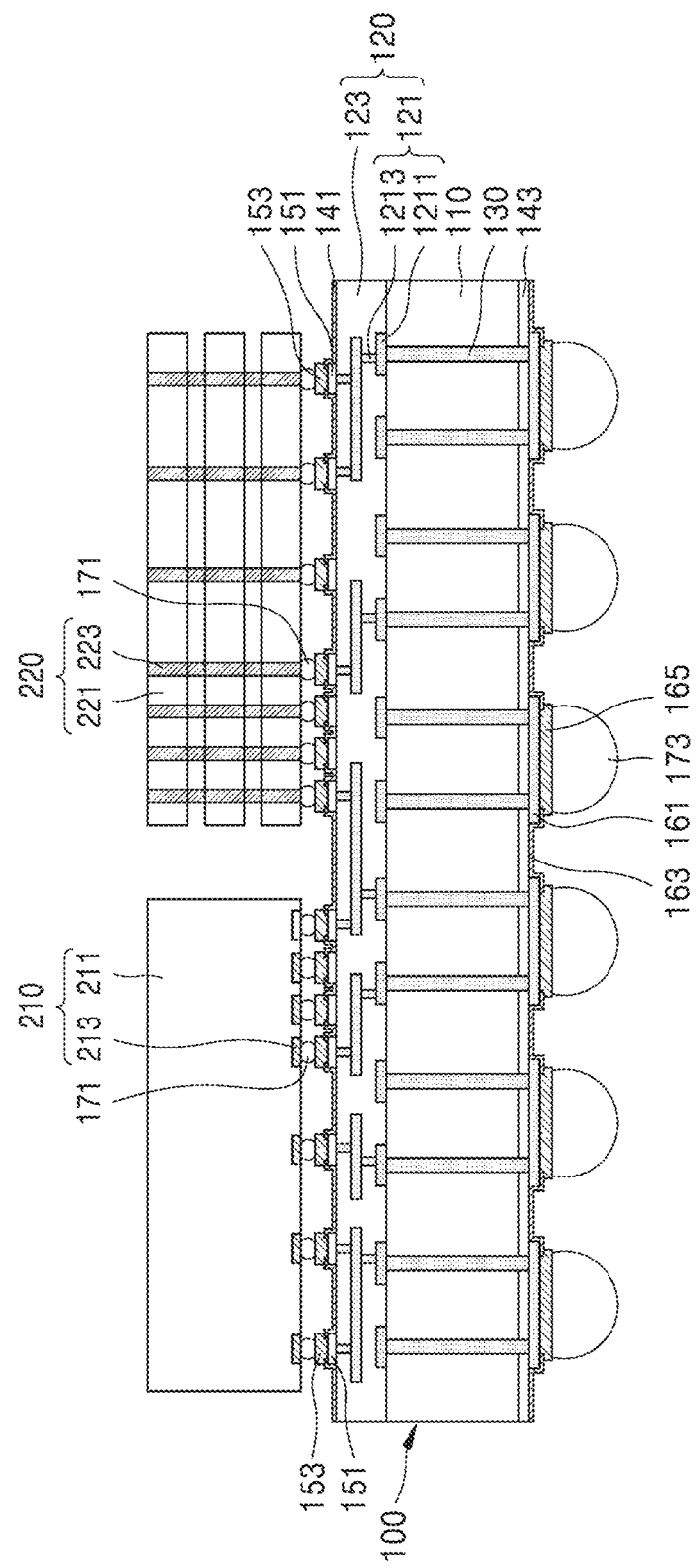
FIGS. 11A and 11B are cross-sectional views illustrating a method of manufacturing a semiconductor package, according to example embodiments of inventive concepts.
Figure 11B:
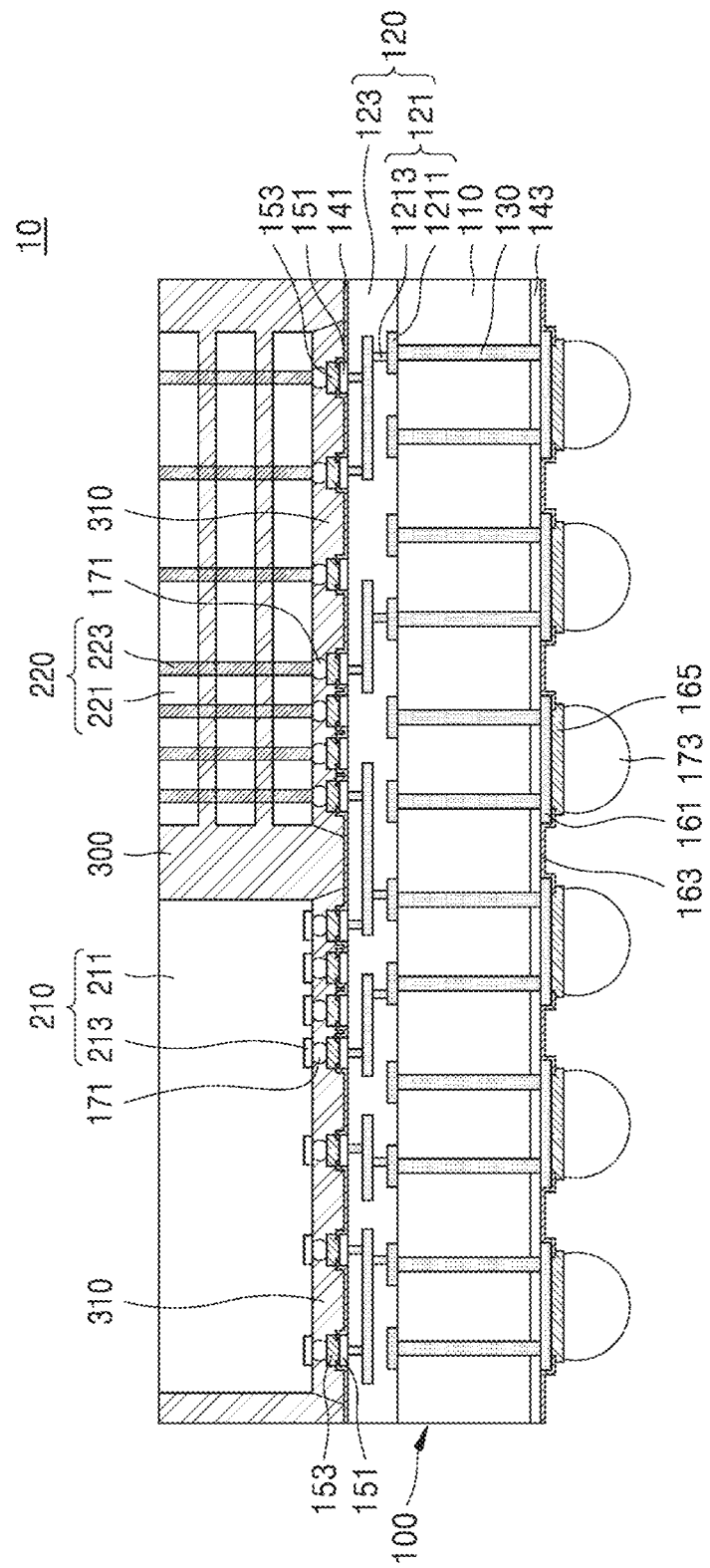

FIGS. 11A and 11B are cross-sectional views illustrating a method of manufacturing a semiconductor package 10 according to example embodiments of inventive concepts.

Referring to FIG. 11A, an interposer 100 may be prepared. Although FIG. 11A illustrates the interposer 100 described with reference to FIGS. 1 to 3, the interposers 100a and 100b described with reference to FIGS. 4A and 4B may also be used.

Next, a first semiconductor chip 210 and a second semiconductor chip 220 may be mounted on the interposer 100. Each of the first semiconductor chip 210 and the second semiconductor chip 220 may be a diced individual semiconductor die or a semiconductor die-molded subpackage. For example, a chip-interposer connection terminal 171 may be formed on the upper connection pillar 153 of the interposer 100, and the first semiconductor chip 210 and the second semiconductor chip 220 may be mounted on the interposer 100 by using the chip-interposer connection terminal 171. In some embodiments, the chip-interposer connection terminal 171 may be a solder ball or a solder bump.

Referring to FIG. 11B, a molding unit 300 covering at least a portion of the first semiconductor chip 210 and at least a portion of the second semiconductor chip 220 may be formed.

The molding unit 300 may protect the first semiconductor chip 210 and the second semiconductor chip 220 from an external influence such as an impact. In order to perform such a function, the molding unit 300 may be formed to include an epoxy mold compound (EMC), a resin, or the like. The molding unit 300 may be formed by a process such as compression molding, lamination, or screen printing. In some embodiments, the molding unit 300 may cover only the side surfaces of the first semiconductor chip 210 and the second semiconductor chip 220 in order to expose the top surfaces of the first semiconductor chip 210 and the second semiconductor chip 220 to the outside thereof. Alternatively, in other embodiments, the molding unit 300 may further cover the top surface of the first semiconductor chip 210 and the top surface of the second semiconductor chip 220.

In the process of connecting the chip-interposer connection terminal 171 to the first semiconductor chip 210 and the chip-interposer connection terminal 171 to the second semiconductor chip 220, a gap may be formed between the chip-interposer connection terminal 171 and the first semiconductor chip 210 and between the chip-interposer connection terminal 171 and the second semiconductor chip 220. Because the gap may cause a problem in the connection reliability between the chip-interposer connection terminal 171 and each of the first semiconductor chip 210 and the second semiconductor chip 220, in order to reinforce the connection, a underfill material layer 310 may be formed by injecting and curing a underfill material between the first semiconductor chip 210 and the interposer 100 and between the second semiconductor chip 220 and the interposer 100.

In some embodiments, the molding unit 300 may directly fill a gap between the first semiconductor chip 210 and the chip-interposer connection terminal 171 and a gap between the second semiconductor chip 220 and the chip-interposer connection terminal 171. In this case, the underfill material layer 310 may be omitted.

According to the related art, in the process of manufacturing a semiconductor package using a general large-area interposer, warpage occurs frequently in a reflow process or a molding process, and the joint reliability between the interposer and the semiconductor chip degrades due to the warpage. However, according to the method of manufacturing the semiconductor package 10 according to the example embodiments of inventive concepts, because the semiconductor package 10 is formed by using the interposer 100 with suppressed warpage, defects such as damage of the interconnection due to a crack caused by warpage, damage of the chip-interposer connection terminal 171, and damage of the board-interposer connection terminal 173 may be limited and/or prevented and thus the semiconductor package 10 with improved reliability may be manufactured.

While inventive concepts has been particularly shown and described with reference to embodiments thereof, it will be understood that various changes in form and details may be made therein without departing from the spirit and scope of the following claims.

What is claimed is:

1. An interposer comprising:
a base substrate;
an interconnection structure arranged on a top surface of the base substrate and comprising a metal interconnection pattern;
a connection pad arranged on the interconnection structure and electrically connected to the metal interconnection pattern of the interconnection structure;
an upper passivation layer arranged on the interconnection structure and having compressive stress, a bottom region of the upper passivation layer including a silicon oxide layer, and a bottom surface of the upper passivation layer being coplanar with a bottom surface of the connection pad;
a lower passivation layer arranged on a bottom surface of the base substrate and having compressive stress that is less than the compressive stress of the upper passivation layer;
a lower conductive layer on the lower passivation layer; and
a through electrode penetrating the base substrate and the lower passivation layer and electrically connecting the lower conductive layer to the metal interconnection pattern of the interconnection structure.

2. The interposer of claim 1,
wherein the compressive stress of the upper passivation layer is between about 150 MPa and about 250 MPa, and
the compressive stress of the lower passivation layer is between about 100 MPa and about 200 MPa.

3. The interposer of claim 1,
wherein a thickness of the lower passivation layer is greater than a thickness of the upper passivation layer.

4. The interposer of claim 3,
wherein the thickness of the upper passivation layer is between about 1 µm and about 2 µm, and
the thickness of the lower passivation layer is between about 2 µm and about 3 µm.

5. The interposer of claim 1,
wherein the lower passivation layer includes a silicon oxide layer,
wherein each of the upper passivation layer and the lower passivation layer comprise a silicon nitride layer, and
wherein the silicon oxide layer of the upper passivation layer and the silicon oxide layer of the lower passivation layer are between the silicon nitride layer of the upper passivation layer and the silicon nitride layer of the lower passivation layer.

6. The interposer of claim 1,
wherein the upper passivation layer comprises a first layer on the interconnection structure and comprising the silicon oxide layer, and
wherein the upper passivation layer comprises a second layer arranged on the first layer and comprising a silicon nitride.

7. The interposer of claim 1,
wherein the lower passivation layer comprises a first layer arranged on the bottom surface of the base substrate and comprising a silicon oxide and a second layer arranged on the first layer and comprising a silicon nitride.

8. The interposer of claim 1,
further comprising a connection pad arranged on the interconnection structure and electrically connected to the metal interconnection pattern of the interconnection structure,
wherein the upper passivation layer covers a portion of the connection pad.

9. The interposer of claim 8,
wherein a thickness of the upper passivation layer is equal to a thickness of the connection pad.

10. The interposer of claim 8,
wherein a thickness of the upper passivation layer is greater than a thickness of the connection pad.

11. The interposer of claim 8,
wherein the upper passivation layer comprises a bottom surface facing the interconnection structure and a top surface opposite to the bottom surface of the upper passivation layer, and
the top surface of the upper passivation layer is flat.

12. An interposer comprising:
a base substrate;
an interconnection structure arranged on a top surface of the base substrate and comprising a metal interconnection pattern;
an upper passivation layer covering a top surface of the interconnection structure and having compressive stress;
a connection pad arranged on the top surface of the interconnection structure and electrically connected to the metal interconnection pattern of the interconnection structure, a bottom surface of the connection pad being coplanar with a bottom surface of the upper passivation layer; and
a lower passivation layer covering a bottom surface of the base substrate and having compressive stress,
wherein a thickness of the upper passivation layer is greater than or equal to a thickness of the connection pad,
wherein each of the upper passivation layer and the lower passivation layer comprises a multilayer structure comprising a silicon oxide layer and a silicon nitride layer, and
wherein the silicon oxide layer of the upper passivation layer is on the top surface of the interconnection structure, and the silicon nitride layer of the upper passivation layer is on the silicon oxide layer of the upper passivation layer.

13. The interposer of claim 12,
wherein the upper passivation layer comprises a planarized top surface.

14. The interposer of claim 13,
wherein the thickness of the upper passivation layer is equal to the thickness of the connection pad, and the top surface of the upper passivation layer is coplanar with a top surface of the connection pad.

15. The interposer of claim 13,
wherein the thickness of the upper passivation layer is greater than the thickness of the connection pad, and
the top surface of the upper passivation layer is at a higher level than a top surface of the connection pad.

16. The interposer of claim 12,
wherein the compressive stress of the upper passivation layer is greater than the compressive stress of the lower passivation layer.

17. A semiconductor package comprising: an interposer; and at least one semiconductor chip arranged on the interposer,
wherein the interposer comprises:
a base substrate;
an interconnection structure arranged on a top surface of the base substrate and comprising a metal interconnection pattern;
a connection pad arranged on the interconnection structure and electrically connected to the metal interconnection pattern of the interconnection structure;
an upper passivation layer arranged on the interconnection structure, covering a portion of the connection pad, and having compressive stress;
a lower passivation layer arranged on a bottom surface of the base substrate and having compressive stress;
a lower conductive layer on the lower passivation layer; and
a through electrode penetrating the base substrate and the lower passivation layer and electrically connecting the lower conductive layer to the metal interconnection pattern of the interconnection structure,
wherein a thickness of the lower passivation layer is greater than a thickness of the upper passivation layer.

18. The semiconductor package of claim 17,
wherein the compressive stress of the upper passivation layer is greater than the compressive stress of the lower passivation layer.

19. The semiconductor package of claim 17,
wherein the upper passivation layer comprises a silicon nitride layer and a silicon oxide layer,
the silicon oxide layer and the silicon nitride layer of the upper passivation layer are sequentially stacked on the interconnection structure,
the lower passivation layer comprises a silicon oxide layer and a silicon nitride layer sequentially stacked on the bottom surface of the base substrate, and
wherein the silicon oxide layer of the upper passivation layer and the silicon oxide layer of the lower passivation layer are between the silicon nitride layer of the upper passivation layer and the silicon nitride layer of the lower passivation layer.

* * * * *